(12) United States Patent
Westra

(10) Patent No.: US 7,098,829 B2
(45) Date of Patent: Aug. 29, 2006

(54) DIGITAL TO ANALOG CONVERSION

(75) Inventor: Jan Roelof Westra, Uithoorn (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/511,974

(22) PCT Filed: Mar. 19, 2003

(86) PCT No.: PCT/IB03/01010

§ 371 (c)(1),
(2), (4) Date: Oct. 20, 2004

(87) PCT Pub. No.: WO03/092163

PCT Pub. Date: Nov. 6, 2003

(65) Prior Publication Data

US 2005/0190086 A1  Sep. 1, 2005

(30) Foreign Application Priority Data

Apr. 25, 2002  (EP) .................................. 02076643

(51) Int. Cl.
*H03M 1/66* (2006.01)
(52) U.S. Cl. ....................... 341/144; 341/136
(58) Field of Classification Search ................ 341/133, 341/134, 135, 136, 144, 153; 323/312–315, 323/316; 307/246, 491, 572, 571
See application file for complete search history.

(56) References Cited

U.S. PATENT DOCUMENTS

| | | | | |
|---|---|---|---|---|
| 5,008,671 A | * | 4/1991 | Tuthill | 341/136 |
| 5,059,977 A | | 10/1991 | Herman | |
| 5,254,994 A | * | 10/1993 | Takakura et al. | 341/153 |
| 6,844,835 B1 | * | 1/2005 | Kao | 341/136 |

* cited by examiner

*Primary Examiner*—Brian Young

(57) ABSTRACT

A unit cell for a digital to analog conversion circuit that includes a current source (CS); a first data switch (S1) coupled to the current source (CS); a second data switch (S2) coupled to the current source (CS); a first phase switch (Phi1) coupled between the current source (CS) and the first data switch (S1); a second phase switch (Phi2) coupled between the current source (CS) and the second data switch (S2); a controller arranged to switch between the first (Phi1) and second (Phi2) phase switches in a Break Before Make alternating sequence, and to switch the first (S1) and second (S2) data switches in a Make Before Break sequence. A digital to analog convener circuit constructed using unit cells according to the invention is more area and power efficient than the previously known circuit because it uses only one current source, yet it succeeds in preventing short-circuit error currents between the outputs and solves the problems caused by pulse asymmetry and the influence of switch-charge injection, and provides more linear and better quality output signals.

6 Claims, 3 Drawing Sheets

DIGITAL TO ANALOG CONVERSION

The present invention relates to digital to analog conversion and particularly to a circuit for digital to analog conversion using switched current sources.

One way of effecting digital to analog conversion is to use switched current sources controlled in accordance with the digital input data to generate an analog output signal. The quality of the output signal is determined by both the quality of the elementary current source and the quality of the switching system. Although the quality of current sources is generally satisfactory for present applications, switching systems are not perfect and non-idealities cause noise and distortion of the analog output signal. These non-idealities include pulse asymmetry, switch-charge injection, switched-capacitor currents and short-circuit currents.

Pulse asymmetry is a particularly significant influence on distortion of an analog output signal. It arises because the rising and falling edges of the output signal of a current switch do not have the ideal square shape but instead have a finite slope and thus switching action is not instantaneous. Also, the rising and the falling edges do not necessarily have the same gradient of slope and thus the total charge delivered to the output of the switch varies depending upon the input data sequence in the signal and causes non-linearity. In addition, particularly when MOS transistors are used to implement such circuits, a different amount of charge is usually dumped at the output channel in one switching direction compared to the amount drawn from the output channel in the other switching direction. This is known as switch-charge injection. In digital to analog conversion applications it results in non-linearity in the processing path, and the output signal quality is impaired.

Systems that are specifically sensitive to non-linearities are for example oversampling noise-shaping A/D or D/A converters. These kind of converters move their quantization noise outside the frequency band of interest. Non-linearities in the processing path can cause this quantization noise to fold back into the frequency band of interest, thereby deteriorating the signal quality.

The total charge delivered to the output of a current switch is independent of the rise and fall times of the switch because each pulse has the same start and end conditions, and thus the transfer can be very linear.

However, for a given current using RTZ coding, the total charge delivered to the output is less, and the signal-to-noise ratio (SNR) of the output signal is worse. In addition the RTZ system is more sensitive to clock jitter because there are more edges: every pulse now has a rising edge and a falling edge. Also an RTZ code has more high frequencies which must be filtered out for satisfactory performance.

It has been proposed to improve the traditional RTZ coding technique using a dual RTZ approach in which the original signal is split into two RTZ sequences, one of the signals being slightly time shifted usually by half a clock period, and the two sequences are added to reconstruct the original signal. The output signal is thus cleared of superfluous edges and has no extra high-frequency content.

However in this dual RTZ approach it is necessary to provide two switches and two current sources for each bit-cell circuit and the circuit is twice as large and consumes twice the power of the traditional RTZ circuit. This makes the dual RTZ approach unsuitable for use in high-volume consumer products.

The present invention aims to provide an improved digital to analogue converter which obviates at least some of the disadvantages of the previously suggested systems, and particularly of the known dual RTZ approach.

According to the present invention there is provided a unit cell for a digital to analog conversion circuit comprising;
a current source;
a first data switch coupled to the current source;
a second data switch coupled to the current source;
a first phase switch coupled between the current source and the first data switch;
a second phase switch coupled between the current source and the second data switch;
a controller arranged to switch between the first and second phase switches in a Break Before Make alternating sequence, and to switch the first and second data switches in a Make Before Break sequence.

Preferably the phase switches are formed of MOS transistors. According to a preferred embodiment the data switches comprise MOS transistors.

The data switches may each comprise first and second transistors with common connected sources/emitters, with the drains connected respectively to first and second output lines.

A third transistor is preferably provided for each data switch again with its source/emitter connected in connection with the first and second transistors and with its drain/collector connected to a third output line. The gate/bases of each transistor are connected to the digital data input.

For a better understanding of the present invention, and to show how the same may be carried into effect, reference will now be made to the accompanying drawings, in which.

Figure 1:
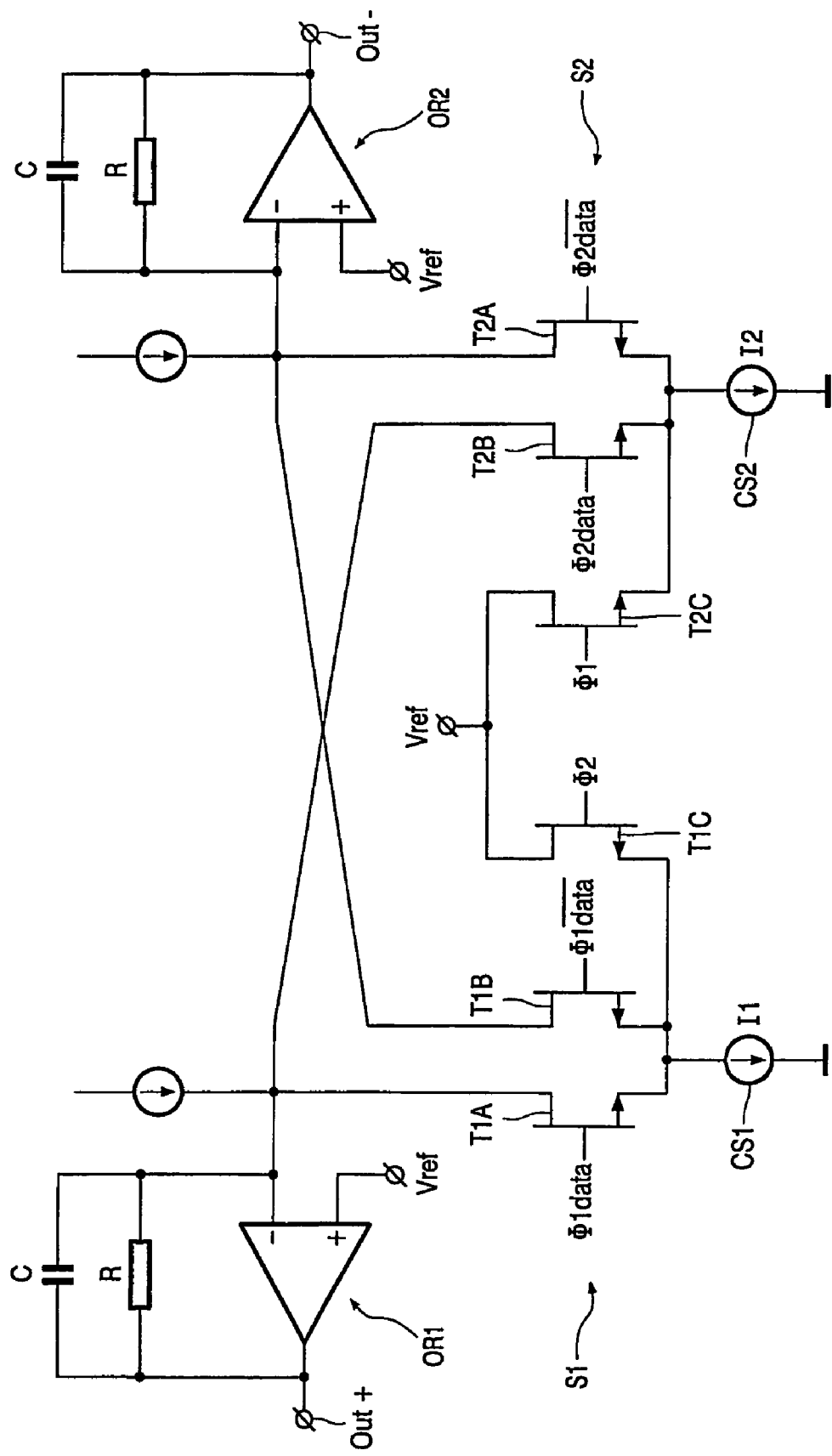
FIG. 1 is a circuit diagram of a known circuit for digital to analog conversion using a dual Return To Zero (RTZ) technique.

In the known circuit of FIG. 1 two current sources CS1 and CS2 are provided generating currents I1 and I2 respectively. The currents I1 and I2 are provided to one or other of two operational amplifiers (opamps) OA1 and OA2, via two data switches S1 and S2, depending upon the phase and state of the input data Each of the two switches S1 and S2 comprises three MOSFET transistors having sources connected to each other. Thus the first switch S1 comprises transistors T1A, T1B and T1C and the second switch SB comprises transistors T2A, T2B and T2C.

Figure 2:
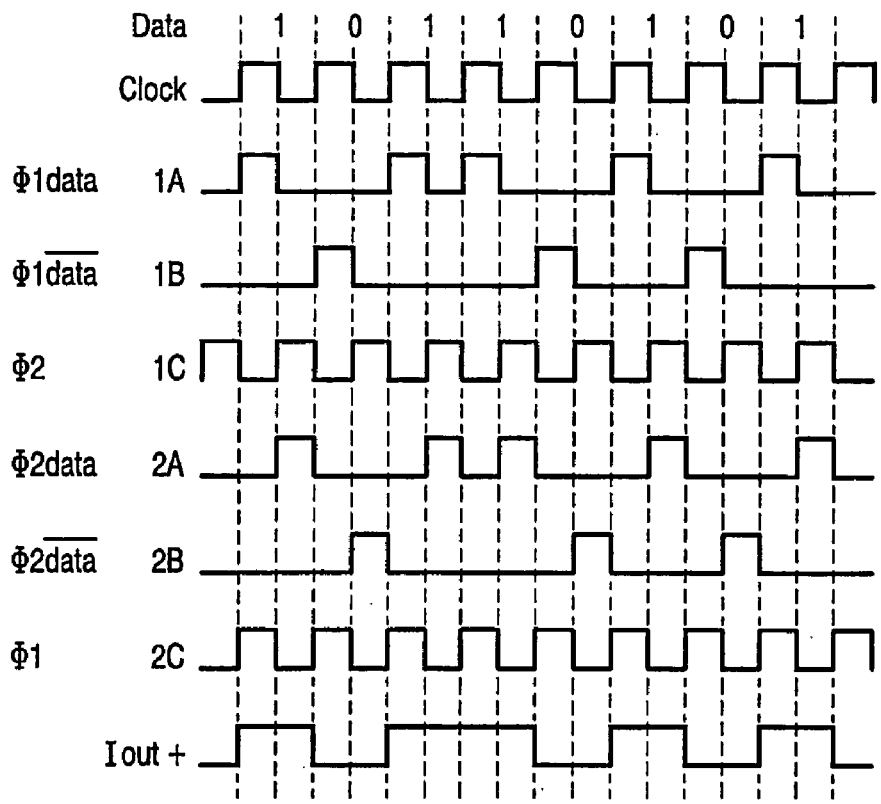
FIG. 2 is a timing diagram for the known circuit of FIG. 1.

FIG. 2 is a timing diagram of signals in the circuit of FIG. 1. The data signal is represented in the top line by the string of logic 1s and 0s and by the line 1A.

A clock pulse is shown in the second line. The frequency of the clock is doubled and phase shifted by half a clock pulse to form two oppositely phased clock pulses $\phi1$ and $\phi2$ which are applied respectively to the gates of transistors to T1C and T2C so that these transistors are switched on during alternate half cycles of the clock pulse. These are shown at 1C and 2C.

The gate signal is applied in the first phase $\phi1$ of the clock pulse, to the gate of transistor T1A and inverted to the gate of transistor T1B. During the second phase $\phi2$ of the clock the data is applied to the gate of transistor T2A and inverted to the gate T2B.

During a first phase $\phi1$ of the clock, the current I1 from the first current source S1 is steered to the first opamp OA1 because transistor T1A is on. At the end of the first phase the current I1 is steered to transistor T1C and diverted to Vref. During phase φ2 the current I2 is steered to opamp OA1 also, via transistor T2B which is on. This current I2 is steered to transistor T2C when the second phase φ2 ends and thus to node Vref.

The same current is delivered on both phases of the clock and so the total current is approximately constant over the clock period. The current output Iout+ is formed from the sum of a return to zero (RTZ) current pulse 1A and delayed RTZ current pulse 2A so the composite sum is free of intersymbol interference. This is well known from the principal of linear superposition.

Switching functions in the circuit of FIG. 1 are in a Make-Before-Break (MBB) sequence to ensure that a path is always provided from the current sources to one of the outputs. This has the disadvantage of allowing short-circuit current interference at the short moment of overlap when the two switches are both closed and a short circuit path exists between the inputs of the two op-amps. The op-amps amplify this short circuit current and transfer it to a voltage at their outputs, introducing an error signal which is dependent on the data signal and, thus non linear, causing distorted output signals.

The outputs of the current switches S1 and S2 are fed to the two opamps OA1 and OA2 which operate single-ended I-V converters using a feedback resistors, typically of 1.8K. The opamps OA1 and OA2 preferably have low noise and distortion characteristics.

Figure 3:
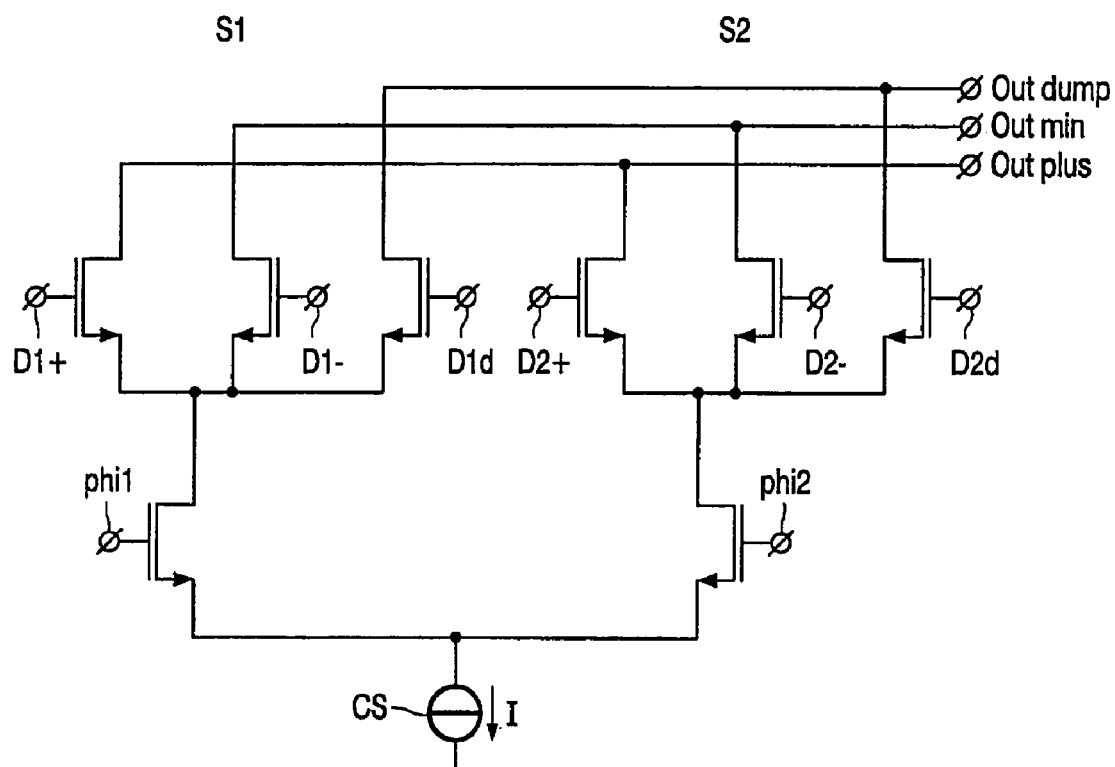
FIG. 3 is a circuit diagram of a circuit for digital to analog conversion according to the present invention.

FIG. 3 illustrates the circuit of the present invention and uses only one current source CS. In FIG. 3 the current I from the current source CS is switched between the two data switches S1 and S2 by two-phase switches Phi 1 and Phi 2.

The phase switches Phi 1 and Phi 2 are operated on a Make Before Break (MBB) sequence. Thus, as can clearly be seen in the timing diagram of FIG. 4, each switch is turned on before the other is turned off. Hence the leading edges of Phi 1 pulses, lead the trailing edges of Phi 2 pulses and vice versa. In this way the Phi 1 and Phi 2 pulses form overlapping clock pulses. The data switches S1 and S2 are arranged so that each only changes state during the half cycle that no current is flowing through it. Thus the first data switch S1 only changes state when first phase switch Phi1 is off, and second phase switch Phi 2 is on. Likewise the second data switch S2 only changes state when first phase switch Phi 1 is on and second phase switch Phi2 is off. This is clearly shown in FIG. 3 where it is clear that the rising and falling edges of the pulses applied to transistors D1+, D2− and D1d all fall at times when the first phase switch Phi 1 pulse is a steady state zero (no current flowing through it) and the second phase switch Phi 2 pulse is a steady state 1. Likewise the rising and falling edges of the pulses applied to transistors D2+, D2− and D2d all fall at times when the second phase switch Phi 2 pulse is a steady state zero (no current flowing through it) and the first phase switch Phi 1 pulse is a steady state 1. That is to say that none of the rising or falling edges of the transistors D1+, D1−, D1d, D2+, D2− and D2d fall at the same time as any rising or falling edge of the phase switch Phi 1 or Phi 2 pulses.

Figure 4:
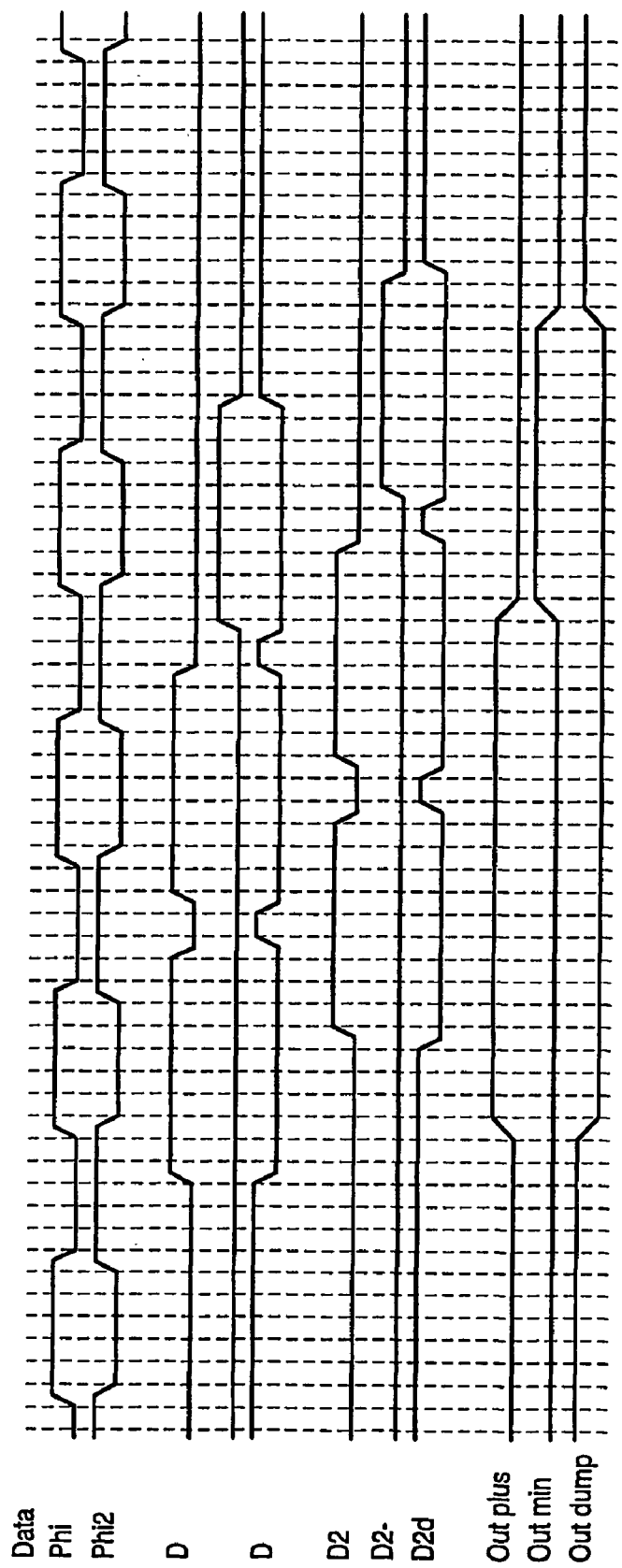
FIG. 4 is a timing diagram for the circuit of FIG. 3.

Turning to FIG. 4 in more detail, the first event in the time line is at time T1 when first phase switch Phi 1 begins to switch from 0 to 1. Because the phase switches are operated on a MBB sequence, then the second phase switch Phi 2 does not start to switch until time T2 when the first phase switch Phi 1 signal completes its rising edge and plateaus at the logic 1 level. As it plateaus the second phase switch Phi 2 signal starts to fall and completes the transition to logic 0 at time T3. During this first illustrated clock pulse, when the first phase witch Phi 1 signal is at logic 1 but both first and second transistors D1+ and D1− in the first data switch (S1) are off (logic 0), the current is dumped via the third transistor D1d to the output terminal Out dump and so this line is high.

At time T4 the phase switches Phi 1 and Phi2 start to change again, with the rising edge of the signal from second phase switch Phi 2 lasting from time T4 to time T5 and the falling edge of the signal from the first phase switch Phi 1 lasting from time T5 to time T6. Second phase switch Phi 2 is now on but transistors D2+ and D2− are off (logic 0) so the current I from current source CS is routed via transistor D2d to the Out dump terminal maintaining this line high.

From time T7 to time T8 the transistor D1d switches off and from time T8 to time T9 transistor D1+ switches on. This switching is in a Break Before Make (BBM) sequence and occurs during a steady state clock period, i.e. when the signal at the first phase switch Phi I is at 0 and the signal at the second phase switch Phi 2 is at 1 and neither are switching.

At time T10 the next clock cycle begins with the first phase switch Phi 1 starting to switch on. In a Make Before Break (MBB) sequence the second phase switch Phi 2 switches off and the switch between the two phase switches Phi 1 and Phi 2 occurs between time T10 and time T11. As the first phase switch Phi 1 switches on it draws the current I to the first data switch 1. At this time transistor D1d is off and transistor D1+ is on and so the current I is diverted to the Out plus line which goes high between time T10 and time T11, at the same time as line Out dump goes low.

At time T12, during the next clock cycle, the second data switch 2 switches transistor D2+ on and transistor D2− off, again in a Make Before Break (MBB) sequence which takes place between time T12 and time T13.

At time T14 the clock cycle changes again and the second phase switch Phi 2 switches on just ahead of the first phase switch Phi 1 switching off. This transition is completed by time T15.

The numbers at the top of FIG. 4 represent the logic state of the data input signal and the figure illustrates how this is represented in the output signals Out plus and Out min in that a logic 0 is represented by Out plus and Out min both being low, a logic 1 by Out plus being high, and a logic 1 by Out min being high.

Using this circuit and switching scheme allows the outputs to be switched to the desired states always from the dump state and back to the dump state so that the amount of switching is identical for any data stream and the linearity of the system is maintained.

Thus when two independent Return to Zero (RTZ) sequences with an offset of half a clock period are fed to the two data switches, the output is effectively the sum of the two and is almost perfectly linear.

A digital to analog convertor circuit constructed using unit cells according to the invention is more area and power efficient than the previously known circuit because it uses only one current source, yet it succeeds in preventing short-circuit error currents between the outputs and solves the problems caused by pulse asymmetry and the influence of switch-charge injection, and provides more linear and better quality output signals.

The invention claimed is:

1. A unit cell for a digital to analog conversion circuit comprising;
    a single current source (CS);
    a first data switch (S1) coupled to the current source (CS);
    a second data switch (S2) coupled to the current source (CS);

a first phase switch (Phi1) coupled between the current source (CS) and the first data switch (S1) to provide a current to the first data switch;

a second phase switch (Phi2) coupled between the current source (CS) and the second data switch (S2) to provide a current to the second data switch;

a controller arranged to switch between the first (Phi1) and second (Phi2) phase switches in a Break Before Make alternating sequence, and to switch the first (S1) and second (S2) data switches in a Make Before Break sequence.

2. A unit cell for a digital analog conversion circuit according to claim 1 wherein the phase switches (Phi1 and Phi2) are formed of MOS transistors.

3. A unit cell for a digital analog conversion circuit according to claim 1 wherein the data switches (S1 and S2) are formed of MOS transistors.

4. A unit cell according to claim 1 wherein the data switches (S1 and S2) each comprise first (D1+, D2+) and second (D1−, D2−) transistors with common connected sources/emitters, with the drains collectors coupled respectively to first (Outputs) and second (Out min) output lines.

5. A unit cell according to claim 4 wherein a third transistor (D1d, D2d) is preferably provided for each data switch (S1, S2) wherein the source/emitter of each of the third transistors (D1d, D2d) is coupled in common with the respective first (D1+, D2+) and second (D1−, D2−) transistors and with its drain/collector coupled to a third output line (Outdump).

6. A unit cell according to claim 4 wherein the gate/bases of each transistor are coupled to the digital data input.

* * * * *